United States Patent
Wang

(10) Patent No.: US 10,204,963 B2
(45) Date of Patent: Feb. 12, 2019

(54) LIGHT EMITTING DIODE CHIP, LIGHT EMITTING DIODE, BACKLIGHT SOURCE AND DISPLAY APPARATUS

(71) Applicants: BOE Technology Group Co., Ltd., Beijing (CN); BOE Optical Science and Technology Co., Ltd., Suzhou, Jiangsu (CN)

(72) Inventor: Tao Wang, Beijing (CN)

(73) Assignees: BOE TECHNOLOGY GROUP CO., LTD., Beijing (CN); BOE OPTICAL SCIENCE AND TECHNOLOGY CO., LTD., Suzhou, Juangsu (CN)

( * ) Notice: Subject to any disclaimer, the term of this patent is extended or adjusted under 35 U.S.C. 154(b) by 11 days.

(21) Appl. No.: 15/519,900

(22) PCT Filed: Oct. 14, 2016

(86) PCT No.: PCT/CN2016/102164
§ 371 (c)(1),
(2) Date: Apr. 18, 2017

(87) PCT Pub. No.: WO2017/067421
PCT Pub. Date: Apr. 27, 2017

(65) Prior Publication Data
US 2017/0250220 A1    Aug. 31, 2017

(30) Foreign Application Priority Data
Oct. 23, 2015   (CN) .......................... 2015 1 0696727

(51) Int. Cl.
*H01L 27/15* (2006.01)
*H01L 33/08* (2010.01)
*G02F 1/1335* (2006.01)
*H01L 33/38* (2010.01)
*H01L 33/44* (2010.01)
*H01L 33/48* (2010.01)
*H01L 33/62* (2010.01)

(52) U.S. Cl.
CPC ...... *H01L 27/156* (2013.01); *G02F 1/133621* (2013.01); *H01L 33/08* (2013.01);
(Continued)

(58) Field of Classification Search
CPC .................................................... H01L 33/385
See application file for complete search history.

(56) References Cited

U.S. PATENT DOCUMENTS 5,693,428 A    12/1997  Fujii et al.
8,314,435 B2 *  11/2012  Lee ..................... H01L 27/3211
                                                        257/40
(Continued)

FOREIGN PATENT DOCUMENTS

CN    101009342 A    8/2007
CN    104900684 A    9/2015
(Continued)

OTHER PUBLICATIONS

First Office Action dated Apr. 19, 2017 in corresponding Chinese Application No. 201510696727.2.
(Continued)

*Primary Examiner* — Chandra Chaudhari
(74) *Attorney, Agent, or Firm* — Nath, Goldberg & Meyer; Joshua B. Goldberg; Daniel Bissing

(57) ABSTRACT

The present invention provides an LED chip including a light-emitting layer, a P electrode, an N electrode, an anode and a cathode, the N electrode, the light-emitting layer and the P electrode are sequentially stacked, the P electrode is electrically connected to the anode, the N electrode is electrically connected to the cathode, the light-emitting layer includes multiple color light-emitting layers whose colors differ from each other, and the multiple color light-emitting layers are provided in a same layer, and electrically connected to the anode through the P electrode and to the
(Continued)

a-a cathode through the N electrode. The present invention further provides an LED, a backlight source and a display apparatus. When an LED including the LED chip is used as a backlight source of a liquid crystal display apparatus, performance ability of the display apparatus on a plurality of colors can be improved during image display.

20 Claims, 3 Drawing Sheets

(52) U.S. Cl.
CPC ............ *H01L 33/385* (2013.01); *H01L 33/44* (2013.01); *H01L 33/483* (2013.01); *H01L 33/62* (2013.01)

(56) References Cited

U.S. PATENT DOCUMENTS

| | | |
|---|---|---|
| 2010/0148147 A1 | 6/2010 | Bour et al. |
| 2018/0120656 A1* | 5/2018 | Okada .................. H01L 27/1225 |

FOREIGN PATENT DOCUMENTS

| | | |
|---|---|---|
| CN | 104966787 A | 10/2015 |
| CN | 105206728 A | 12/2015 |
| CN | 205039172 U | 2/2016 |
| JP | H11-74566 A | 3/1999 |
| JP | 2004-140306 A | 5/2004 |
| WO | 2014/114731 A1 | 7/2014 |
| WO | 2014114731 A1 | 7/2014 |
| WO | 2016/197582 A1 | 12/2016 |
| WO | 2017/012342 A1 | 1/2017 |

OTHER PUBLICATIONS

International Search report forms 210, 220, 237 dated Jan. 20, 2017 in corresponding International Application No. PCT/CN2016/102164 along with an English translation of the International Search Report and an English translation of the Written Opinion of the International Searching Authority.

Chinese office action dated Nov. 29, 2017 for corresponding CN application 201510696727.2 with English translation attached.

* cited by examiner a-a

LIGHT EMITTING DIODE CHIP, LIGHT EMITTING DIODE, BACKLIGHT SOURCE AND DISPLAY APPARATUS

This is a National Phase Application filed under 35 U.S.C. 371 as a national stage of PCT/CN2016/102164, filed Oct. 14, 2016, an application claiming the benefit of Chinese Application No. 201510696727.2, filed Oct. 23, 2015, the content of each of which is hereby incorporated by reference in its entirety.

TECHNICAL FIELD

The present invention relates to the field of light emitting diodes, and particularly relates to a light emitting diode chip, a light emitting diode including the light emitting diode chip, a backlight source including the light emitting diode, and a display apparatus including the backlight source.

BACKGROUND

A backlight source of a liquid crystal display apparatus typically emits white light, and to generate white light, yellow fluorescent powder is generally added into a blue light emitting diode (LED) in the backlight source. However, a display apparatus including this backlight source is not very good at showing red and green.

Therefore, how to improve performance ability of a display apparatus on a variety of colors becomes a technical problem to be solved urgently in the art.

SUMMARY

An object of the present invention is to provide a light emitting diode (LED) chip, an LED including the LED chip, a backlight source including the LED, and a display apparatus including the backlight source. The display apparatus has good performance ability on a variety of colors.

As one aspect of the present invention, there is provided an LED chip, which includes a light emitting layer, a P electrode, an N electrode, an anode and a cathode, the N electrode, the light emitting layer and the P electrode being sequentially stacked, the P electrode being electrically connected to the anode, and the N electrode being electrically connected to the cathode, wherein the light emitting layer includes a plurality of color light emitting layers whose colors differ from each other, and the plurality of color light emitting layers are provided in a same layer, and electrically connected to a same anode (said anode) through a same P electrode (said P electrode) and to a same cathode (said cathode) through a same N electrode (said N electrode).

Optionally, an insulating spacer is provided between two adjacent color light emitting layers.

Optionally, the light emitting layer is provided on the N electrode, and the cathode is provided on a portion of the N electrode where the light emitting layer is not provided.

Optionally, the P electrode is provided on the light emitting layer to be in contact with each color light emitting layer and is electrically isolated from the cathode, and the anode is provided above the P electrode.

Optionally, the plurality of color light emitting layers are arranged side by side, and a size of the P electrode in an arrangement direction of the plurality of color light emitting layers is no smaller than a size of the light emitting layer in the arrangement direction of the plurality of color light emitting layers.

Optionally, the light emitting layer includes two color light emitting layers, and the size of the P electrode in an arrangement direction of the plurality of color light emitting layers is smaller than the size of the light emitting layer in the arrangement direction of the plurality of color light emitting layers.

Optionally, the P electrode is symmetric with respect to a gap between the two color light emitting layers.

Optionally, the light emitting layer includes four color light emitting layers arranged in two rows and two columns, and the P electrode is located in the middle of the light emitting layer.

Optionally, an overlapping region between the P electrode and each color light emitting layer has a same area.

Optionally, the light emitting layer includes at least two of a red light emitting layer, a green light emitting layer and a blue light emitting layer.

Optionally, the light emitting layer includes a red light emitting layer, a green light emitting layer, a blue light emitting layer and a yellow light emitting layer.

Optionally, the light emitting diode chip further includes a substrate, and the N electrode covers the substrate.

Optionally, projections of the P electrode and the cathode on a plane where the light emitting layer is located are on two opposite sides of the light emitting layer, respectively.

As another aspect of the present invention, there is provided an LED including an LED chip, a packaging case and a gold wire, the LED chip being provided in the packaging case, wherein the LED chip is the above-described LED chip provided by the present invention, and the gold wire is electrically connected to the anode.

As still another aspect of the present invention, there is provided a backlight source including an LED, which is the above-described LED provided by the present invention.

As yet another aspect of the present invention, there is provided a display apparatus including a backlight source, which is the above-described backlight source provided by the present invention.

An LED can be obtained after packaging the LED chip. Because the LED includes therein a plurality of color light emitting layers having colors different from each other and the plurality of color light emitting layers share anode and cathode, the color light emitting layers in the LED chip will emit light when the anode and the cathode of the LED are respectively supplied with voltages. Because the light emitting layer includes the plurality of color light emitting layers having colors different from each other, light emitted from the LED is a mixture of light respectively emitted from the color light emitting layers. When an LED including the LED chip is used as a backlight source of a liquid crystal display apparatus, performance ability of the display apparatus on a variety of colors can be improved during image display, which in turn improves color gamut of the liquid crystal display apparatus effectively.

Since the color light emitting layers having different colors share the anode and the cathode, only one gold wire is required, thereby simplifying packaging process of an LED.

BRIEF DESCRIPTION OF THE DRAWINGS

Accompanying drawings, which constitute a part of the specification, are used for providing a further understanding of the present invention, and used for explaining the present invention together with the following specific implementations, but not intended to limit the present invention. In the accompanying drawings.

DETAILED DESCRIPTION OF THE EMBODIMENTS

The specific implementations of the present invention will be described in detail below in conjunction with the accompanying drawings. It should be understood that, the specific implementations described herein are merely for describing and explaining the present invention, rather than limiting the present invention.

Figure 1:
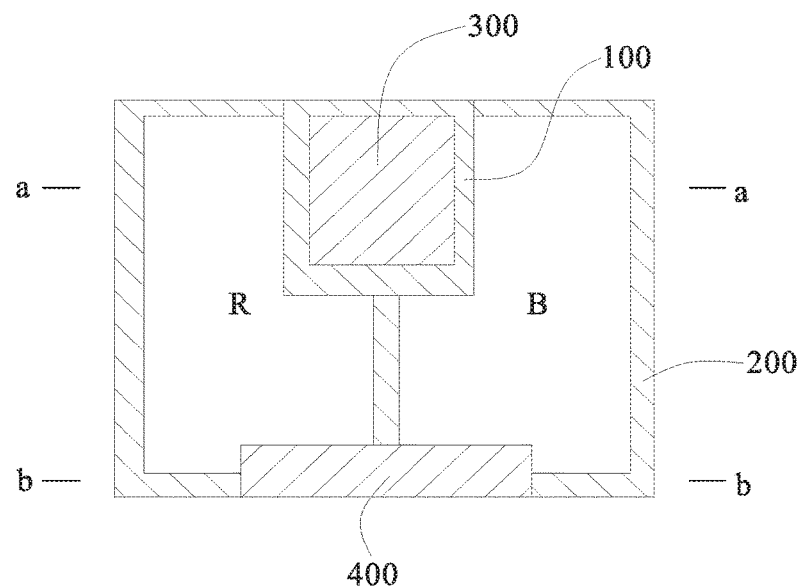
FIG. 1 is a schematic top view of an LED chip provided by an embodiment of the present invention.
Figure 2:
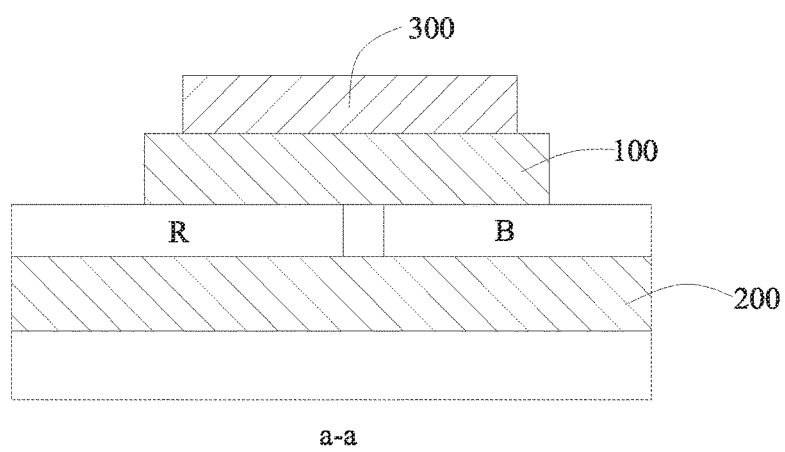
FIG. 2 is a cross-sectional view of the LED chip shown in FIG. 1 taken along line a-a.
Figure 3:
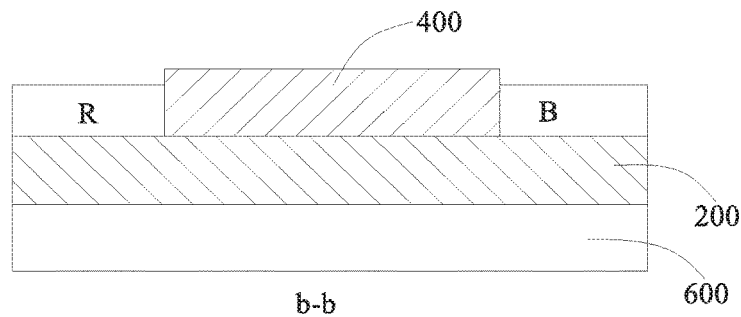
FIG. 3 is across-sectional view of the LED chip shown in FIG. 1 taken along line b-b.
Figure 7:
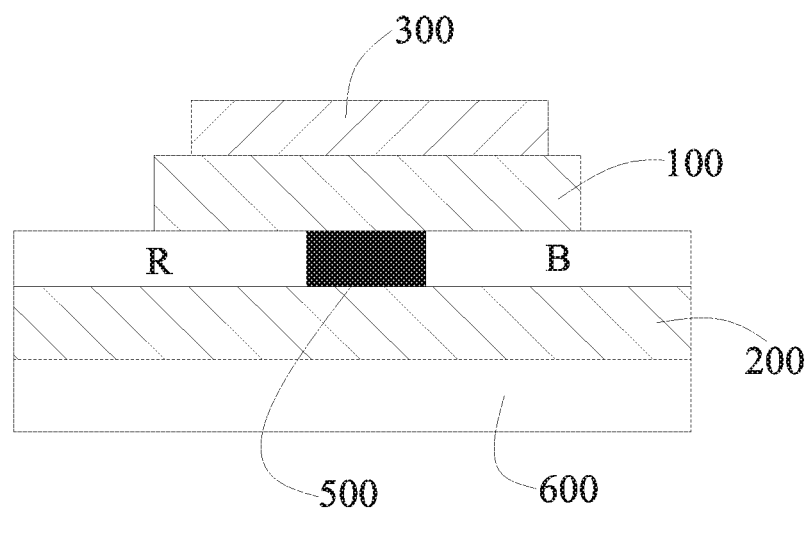
FIG. 7 is a cross-sectional view of the LED shown in FIG. 6 taken along line c-c.

As one aspect of the present invention, there is provided an LED chip. As shown in FIG. 1, the LED chip includes a light emitting layer, a P electrode 100, an N electrode 200, an anode 300 and a cathode 400. The N electrode 200, the light emitting layer and the P electrode 100 are sequentially stacked. For example, as shown in FIGS. 2, 3 and 7, the P electrode 100 is provided on the light emitting layer, and the N electrode 200 is provided under the light emitting layer (that is, the P electrode 100 and the N electrode 200 are respectively provided at two sides of the light emitting layer in a thickness direction of the light emitting layer). The P electrode 100 is electrically connected to the anode 300, and the N electrode 200 is electrically connected to the cathode 400. The light emitting layer includes a plurality of color light emitting layers having colors different from each other, and the plurality of color light emitting layers are provided in a same layer, and are electrically connected to a same anode 300 through a same P electrode 100 and to a same cathode 400 through a same N electrode 200.

A LED can be obtained after packaging the LED chip. Because the LED includes therein a plurality of color light emitting layers having colors different from each other, and the plurality of color light emitting layers having colors different from each other share the anode 300 and the cathode 400, the light emitting layer in the LED chip will emit light when the anode 300 and the cathode 400 of the LED are respectively supplied with voltages. Because the light emitting layer includes the plurality of color light emitting layers having colors different from each other, light emitted from the LED is a mixture of light respectively emitted from the plurality of color light emitting layers. When a LED including the LED chip is used as a backlight source of a liquid crystal display apparatus, performance ability of the display apparatus on a variety of colors can be improved during image display, which in turn improves color gamut of the liquid crystal display apparatus effectively.

Since the color light emitting layers having different colors share the anode 300, the anode 300 can be electrically connected to an external pin with only one gold wire, thereby simplifying packaging process of an LED.

In the present invention, the specific arrangement of the color light emitting layers is not particularly limited, for example, the plurality of color light emitting layers may be arranged side by side, or arranged in a matrix.

In some embodiments, the light emitting layer of the LED chip may include a red light emitting layer R and a blue light emitting layer B, as shown in FIG. 1. In this case, as shown in FIG. 2, the red light emitting layer R and the blue light emitting layer B share the P electrode 100 (for example, both the red light emitting layer R and the blue light emitting layer. B are in contact with the P electrode 100), and the anode 300 is provided on the P electrode 100 (the red light emitting layer. R and the blue light emitting layer B share the same anode 300 through the P electrode 100). The red light emitting layer R and the blue light emitting layer B share the N electrode 200 (for example, both the red light emitting layer R and the blue light emitting layer B are in contact with the N electrode 200), and the cathode 400 is provided on the N electrode 200 (the red light emitting layer R and the blue light emitting layer B share the same cathode 400 through the N electrode 200).

As the light emitting layer of the LED shown in FIG. 1 includes the red light emitting layer R and the blue light emitting layer B, light emitted from the LED is a mixture of red light and blue light.

When an LED including the LED chip shown in FIG. 1 is used as a backlight source of a liquid crystal display apparatus, performance ability of the liquid crystal display apparatus on red light and blue light can be improved during image display, which in turn improves color gamut of the liquid crystal display apparatus effectively.

Figure 4:
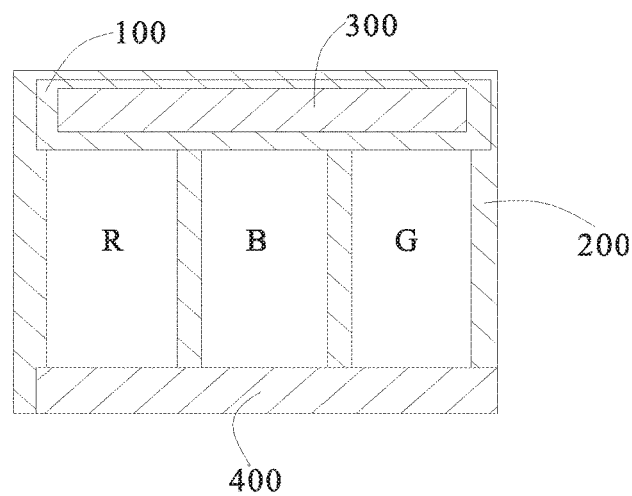
FIG. 4 is a schematic top view of an LED provided by an embodiment of the present invention.

In some embodiments, the light emitting layer of the LED chip includes a red light emitting layer R, a green light emitting layer G and a blue light emitting layer B, as shown in FIG. 4. Therefore, light emitted from an LED including the LED chip shown in FIG. 4 is white light.

When an LED including the LED chip shown in FIG. 4 is used as a backlight source of a liquid crystal display apparatus, performance ability of the display apparatus on red light, blue light and green light can be improved during image display, which in turn improves color gamut of the liquid crystal display apparatus effectively.

Figure 5:
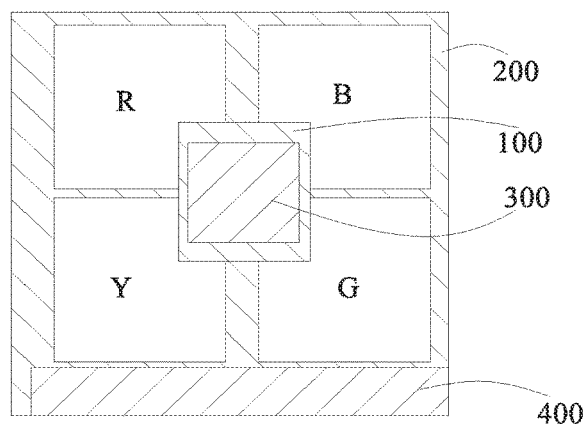
FIG. 5 is a schematic top view of another LED provided by an embodiment of the present invention.

In some embodiments, the light emitting layer of the LED chip includes a red light emitting layer R, a green light emitting layer G, a blue light emitting layer B and a yellow light emitting layer Y, as shown in FIG. 5. Therefore, light emitted from an LED including the LED chip shown in FIG. 5 is white light. In the embodiments of the present invention, the light emitting layer includes four color light emitting layers, namely, the red light emitting layer R, the green light emitting layer G, the blue light emitting layer B and the yellow light emitting layer Y, but a person skilled in the art should understand that the yellow light emitting layer Y may be replaced with a white light emitting layer or a light emitting layer of another color.

When an LED including the LED chip shown in FIG. 5 is used as a backlight source of a liquid crystal display apparatus, performance ability of the display apparatus on red light, blue light, green light and yellow light can be improved during image display, which in turn improves color gamut of the liquid crystal display apparatus effectively.

To improve color purity of light emitted from an LED, optionally, in the LED chip provided by the present invention, the plurality of color light emitting layers having colors different from each other are insulatedly separated. In the present invention, how to insulatedly separate the plurality of color light emitting layers having colors different from each other in the LED chip is not particularly limited. For example, a groove may be provided between adjacent color light emitting layers, so as to insulatedly separate the plurality of color light emitting layers having colors different from each other.

Figure 6:
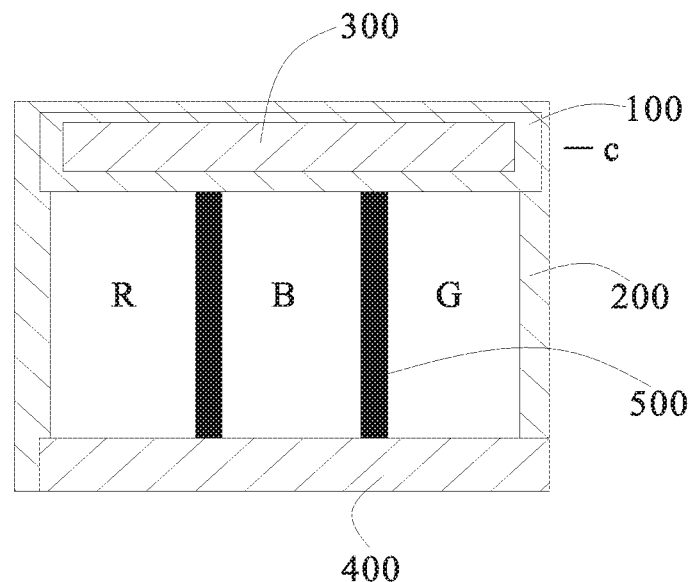
FIG. 6 is a schematic top view of still another LED provided by an embodiment of the present invention.

To ensure that the plurality of color light emitting layers having colors different from each other are insulated from each other, optionally, as shown in FIGS. 6 and 7, an insulating spacer 500 is provided between two adjacent color light emitting layers.

In the present invention, material of the insulating spacer 500 is not particularly limited, for example, the insulating spacer 500 may be made of a ceramic material, a silicon oxide or a silicon nitride.

It can be easily understood that, the LED chip further includes a substrate 600. In some embodiments, N electrode 200 covers the substrate 600, the light emitting layer is provided on the N electrode 200, the cathode 400 is provided on a portion of the N electrode 200 where the light emitting layer is not provided (in the presence of the insulating spacer 500, the cathode 400 is provided on a portion of the N electrode 200 where neither the light emitting layer nor the insulating spacer 500 is provided) and may be in contact with the N electrode 200. The cathode 400 and the light emitting layer may be on a same surface of the N electrode 200, and the specific arrangement of the cathode 400 is not particularly limited in the present invention, as long as the cathode 400 can be electrically connected to the N electrode 200 so that all the color light emitting layers can share a same cathode 400 through a same N electrode 200. For example, the N electrode 200 may cover the substrate 600, edge of the N electrode 200 may exceeds edge of the light emitting layer (i.e., a projection of the light emitting layer on the substrate 600 is smaller than and completely within a projection of the N electrode 200 on the substrate 600), and the cathode 400 is provided on a portion of the N electrode 200 where the light emitting layer is not provided.

In the present invention, the specific arrangement of the anode 300, the P electrode 100 and the light emitting layer is not particularly limited, as shown in FIGS. 1, 2, 4 and 6, the P electrode 100 is on the light emitting layer, and the anode 300 is provided on the P electrode 100. That is, as shown in FIG. 2, the light emitting layer, the P electrode 100 and the anode 300 are sequentially stacked from bottom to top. For example, the P electrode 100 is arranged to be in contact with each of the color light emitting layers. It can be understood that the P electrode 100 and the cathode 400 are electrically isolated from each other. Optionally, projections of the P electrode 100 and the cathode 400 on a plane where the light emitting layer is located are on two opposite sides of the light emitting layer, respectively, as shown in FIGS. 1, 4 and 6.

In the present invention, the size of the P electrode 100 is not particularly limited, as long as the P electrode 100 can contact every color light emitting layer in the light emitting layer.

In some embodiments, for example, as shown in FIGS. 4 and 6, a size of the P electrode 100 in an arrangement direction of the plurality of color light emitting layers is no smaller than a size of the light emitting layer in the arrangement direction of the plurality of color light emitting layers. In the embodiments shown in FIGS. 4 and 6, the plurality of color light emitting layers are a red light emitting layer R, a blue light emitting layer B and a green light emitting layer G, respectively, and the arrangement direction of the color light emitting layers is a left-to-right direction in the figures, thus the size of the P electrode 100 in the left-to-right direction is larger than the size of the light emitting layer in the left-to-right direction, and in this way, light emitted from the color light emitting layers is more uniform. In addition, because contact area between the light emitting material and the P electrode in this case is relatively large, light emitting efficiency can be increased. In this case, the P electrode 100 may be in the shape of a rectangle.

In some embodiments, for example, as shown in FIG. 1, the light emitting layer includes two color light emitting layers, and the size of the P electrode 100 in the arrangement direction of the color light emitting layers is smaller than the size of the light emitting layer in the arrangement direction of the color light emitting layers. In the embodiment shown in FIG. 1, the plurality of color light emitting layers are a red light emitting layer R and a blue light emitting layer B, respectively, the arrangement direction of the color light emitting layers is the left-to-right direction, and in this case, the size of the P electrode 100 in the left-to-right direction is smaller than the size of the light emitting layer in the left-to-right direction. In order that light emitted from the red light emitting layer R and the blue light emitting layer B is uniform, the P electrode 100 may be symmetric with respect to a gap between the two color light emitting layers, as shown in FIG. 1.

In some embodiments, for example, as shown in FIG. 5, the light emitting layer includes four color light emitting layers arranged in a matrix, specifically in two rows and two columns, and the P electrode 100 is located in the middle of the light emitting layer. In the implementation shown in FIG. 5, a red light emitting layer R, a blue light emitting layer B, a yellow light emitting layer Y and a green light emitting layer G are arranged in two rows and two columns, and the P electrode 100 is located in the middle of the upper surface of the light emitting layer such that the P electrode 100 can contact with the red light emitting layer R, the blue light emitting layer B, the green light emitting layer. G and the yellow light emitting layer Y simultaneously. Optionally, the P electrode 100 has a same overlapping area with each of the color light emitting layers, so as to allow the red light emitting layer R, the blue light emitting layer B, the green light emitting layer G and the yellow light emitting layer Y to emit light substantially uniform light.

As another aspect of the present invention, there is provided an LED, which includes an LED chip, a packaging case and a gold wire, the LED chip is provided in the packaging case, wherein the LED chip is the above-described LED chip provided by the present invention, and the gold wire is electrically connected to the anode 300.

As described above, an LED can be obtained after packaging the LED chip. Because the LED includes therein a plurality of color light emitting layers having colors different from each other and the plurality of color light emitting layers share the anode 300 and the cathode 400, the color light emitting layers in the LED chip will emit light when the anode 300 and the cathode 400 of the LED are respectively supplied with voltages. Because the light emitting layer includes the plurality of color light emitting layers having colors different from each other, light emitted from the LED is a mixture of light respectively emitted from the color light emitting layers.

When an LED including the LED chip is used as a backlight source of a liquid crystal display apparatus, performance ability of the display apparatus on a variety of colors can be improved during image display, which in turn improves color gamut of the liquid crystal display apparatus effectively.

Since the color light emitting layers having different colors share the anode 300 and the cathode 400, only one gold wire is required, thereby simplifying packaging process of an LED.

In the present invention, the anode and the cathode are made of a conductive material, for example, the anode and the cathode may be made of a metal, and in this case, the anode and the cathode may be formed by physical vapor deposition, respectively. The P electrode 100 and the N electrode 200 may be formed by chemical vapor deposition.

As still another aspect of the present invention, there is provided a backlight source, which includes an LED, wherein the LED is the above-described LED provided by the present invention.

As yet another aspect of the present invention, there is provided a display apparatus, which includes a backlight source, wherein the backlight source is the above-described backlight source provided by the present invention.

It could be understood that the above implementations are only exemplary implementations for describing the principle of the present invention, but the present invention is not limited thereto. Those skilled in the art may make various variations and improvements without departing from the spirit and the essence of the present invention, and these variations and the improvements are also considered as falling into the protection scope of the present invention.

The invention claimed is:

1. A light emitting diode (LED) chip, comprising a light emitting layer, a P electrode, an N electrode, an anode and a cathode, the N electrode, the light emitting layer and the P electrode being sequentially stacked, the P electrode being electrically connected to the anode, and the N electrode being electrically connected to the cathode, wherein the light emitting layer comprises a plurality of color light emitting layers whose colors differ from each other, and the plurality of color light emitting layers are provided in a same layer, and are all electrically connected to the anode through the P electrode and to the cathode through the N electrode.

2. The LED chip according to claim 1, wherein an insulating spacer is provided between two adjacent color light emitting layers.

3. The LED chip according to claim 1, wherein the light emitting layer is provided on the N electrode, and the cathode is provided on a portion of the N electrode where the light emitting layer is not provided.

4. The LED chip according to claim 1, wherein the P electrode is provided on the light emitting layer and in contact with each of the color light emitting layers, the P electrode is electrically isolated from the cathode, and the anode is provided on the P electrode.

5. The LED chip according to claim 4, wherein the plurality of color light emitting layers are arranged side by side, and a size of the P electrode in an arrangement direction of the plurality of color light emitting layers is no smaller than a size of the light emitting layer in the arrangement direction of the plurality of color light emitting layers.

6. The LED chip according to claim 4, wherein the light emitting layer comprises two color light emitting layers, and a size of the P electrode in an arrangement direction of the plurality of color light emitting layers is smaller than a size of the light emitting layer in the arrangement direction of the plurality of color light emitting layers.

7. The LED chip according to claim 6, wherein the P electrode is symmetric with respect to a gap between the two color light emitting layers.

8. The LED chip according to claim 3, wherein the light emitting layer comprises four color light emitting layers arranged in two rows and two columns, and the P electrode is located in the middle of the light emitting layer.

9. The LED chip according to claim 8, wherein an overlapping region between the P electrode and each of the color light emitting layers has a same area.

10. The LED chip according to claim 1, wherein the light emitting layer comprises at least two of a red light emitting layer, a green light emitting layer, and a blue light emitting layer.

11. The LED chip according to claim 1, wherein the light emitting layer comprises a red light emitting layer, a green light emitting layer, a blue light emitting layer and a yellow light emitting layer.

12. The LED chip according to claim 3, wherein the LED chip further comprises a substrate, and the N electrode covers the substrate.

13. The LED chip according to claim 4, wherein projections of the P electrode and the cathode on a plane where the light emitting layer is located are on two opposite sides of the light emitting layer, respectively.

14. A light emitting diode (LED), comprising an LED chip, a packaging case and a gold wire, the LED chip being provided in the packaging case, wherein the LED chip is the LED chip according to claim 1, and the gold wire is electrically connected to the anode.

15. A backlight source, comprising an LED according to claim 14.

16. A display apparatus, comprising a backlight source according to claim 15.

17. The LED chip according to claim 3, wherein the light emitting layer comprises at least two of a red light emitting layer, a green light emitting layer, and a blue light emitting layer.

18. The LED chip according to claim 5, wherein the light emitting layer comprises a red light emitting layer, a green light emitting layer, a blue light emitting layer and a yellow light emitting layer.

19. The LED chip according to claim 5, wherein the light emitting layer comprises at least two of a red light emitting layer, a green light emitting layer, and a blue light emitting layer.

20. The LED chip according to claim 6, wherein the light emitting layer comprises a red light emitting layer, a green light emitting layer, a blue light emitting layer and a yellow light emitting layer.

* * * * *